US012562746B2

(12) United States Patent
Lin et al.

(10) Patent No.: US 12,562,746 B2
(45) Date of Patent: Feb. 24, 2026

(54) WIRED COMMUNICATION RECEIVER WITH DC LEVEL SHIFT

(71) Applicant: REALTEK SEMICONDUCTOR CORPORATION, Hsinchu (TW)

(72) Inventors: Jian-Ru Lin, Hsinchu (TW); Ying-Cheng Wu, Hsinchu (TW); Yung-Tai Chen, Hsinchu (TW); Jun-Ye Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/792,106

(22) Filed: Aug. 1, 2024

(65) Prior Publication Data

US 2025/0062772 A1 Feb. 20, 2025

(30) Foreign Application Priority Data

Aug. 18, 2023 (TW) ................................. 112131177

(51) Int. Cl.

| | |
|---|---|
| *H03M 1/00* | (2006.01) |
| *H03M 1/06* | (2006.01) |
| *H04L 25/02* | (2006.01) |
| *H04B 1/04* | (2006.01) |

(52) U.S. Cl.
CPC ......... *H03M 1/002* (2013.01); *H03M 1/0607* (2013.01); *H04L 25/0276* (2013.01); *H04B 1/04* (2013.01)

(58) Field of Classification Search
CPC ..... G06F 1/06; H03F 1/26; H03F 1/32; H03F 3/45; H03K 3/356; H03K 5/00; H03K 17/687; H03K 19/0175; H03M 1/00;

H03M 1/06; H03M 1/12; H03M 1/34; H03M 1/002; H03M 1/0607; H03M 3/00; H04L 25/02; H04L 25/0276
USPC ........ 341/118, 122, 155, 161, 172; 375/219, 375/295, 316
See application file for complete search history.

(56) References Cited

U.S. PATENT DOCUMENTS

| | | |
|---|---|---|
| 2015/0304135 A1 | 10/2015 | Scouten |
| 2021/0083684 A1 | 3/2021 | Waki |
| 2024/0146269 A1* | 5/2024 | Othman Mohamed Mohamed ElShater ............. H04L 25/0276 |

OTHER PUBLICATIONS

OA letter of a counterpart TW application (appl. No. 112131177) mailed on Apr. 11, 2024.

* cited by examiner

*Primary Examiner* — Shawkat M Ali
(74) *Attorney, Agent, or Firm* — WPAT, PC

(57) ABSTRACT

A receiver for wired communication includes a DC (direct current) level shift circuit and an analog-to-digital converter circuit. The DC level shift circuit is configured to receive a first signal and generate a second signal, in which the DC level shift circuit comprises a capacitor, and the DC level shift circuit is further configured to transmit a first common-mode voltage in a first voltage domain to a first terminal of the capacitor and transmit a second common-mode voltage in a second voltage domain to a second terminal of the capacitor before the first signal is received, and when the DC level shift circuit receives the first signal, the DC level shift circuit stops transmitting the first common-mode voltage and the second common-mode voltage to the capacitor. The analog-to-digital converter circuit is configured to generate a digital signal according to the second signal.

15 Claims, 4 Drawing Sheets

100

101

SD1 Transmitter 110

SD2

120

Hybrid circuit 122 — S1 → Filter circuit 124 — S2 → DC level shift circuit 126 — S3 → Analog-to-digital converter circuit 128 → SD3

Corresponds to first voltage domain ---▶ VCM1   VCM2 ◀--- Corresponds to second voltage domain

WIRED COMMUNICATION RECEIVER WITH DC LEVEL SHIFT

BACKGROUND OF THE INVENTION

1. Field of the Invention

The present disclosure relates to a receiver, especially to a receiver that employs passive circuit(s) for DC level shift.

2. Description of Related Art

In related applications of wired communication, a transmitter and a receiver in an electronic device may transmit and receive data via the same terminal. To increase the connection distance, the transmitter often utilizes higher power to send data, resulting in increased overall power consumption. In existing approaches, a source follower circuit is commonly employed for level conversion to reduce the signal level processed by the receiver, thereby reducing overall power consumption. However, in practical applications, the active components within the source follower still introduce additional power consumption, and mismatches among these active components may cause nonlinear distortion to the output of the source follower.

SUMMARY OF THE INVENTION

In some aspects of the present disclosure, an object of the present disclosure is, but not limited to, provide a receiver that employs passive circuit(s) for DC level shift, so as to make an improvement to the prior art.

In some aspects of the present disclosure, a receiver for wired communication includes a DC (direct current) level shift circuit and an analog-to-digital converter circuit. The DC level shift circuit is configured to receive a first signal and generate a second signal, in which the DC level shift circuit comprises a capacitor, and the DC level shift circuit is further configured to transmit a first common-mode voltage in a first voltage domain to a first terminal of the capacitor and transmit a second common-mode voltage in a second voltage domain to a second terminal of the capacitor before the first signal is received, and when the DC level shift circuit receives the first signal, the DC level shift circuit stops transmitting the first common-mode voltage and the second common-mode voltage to the capacitor. The analog-to-digital converter circuit is configured to generate a digital signal according to the second signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
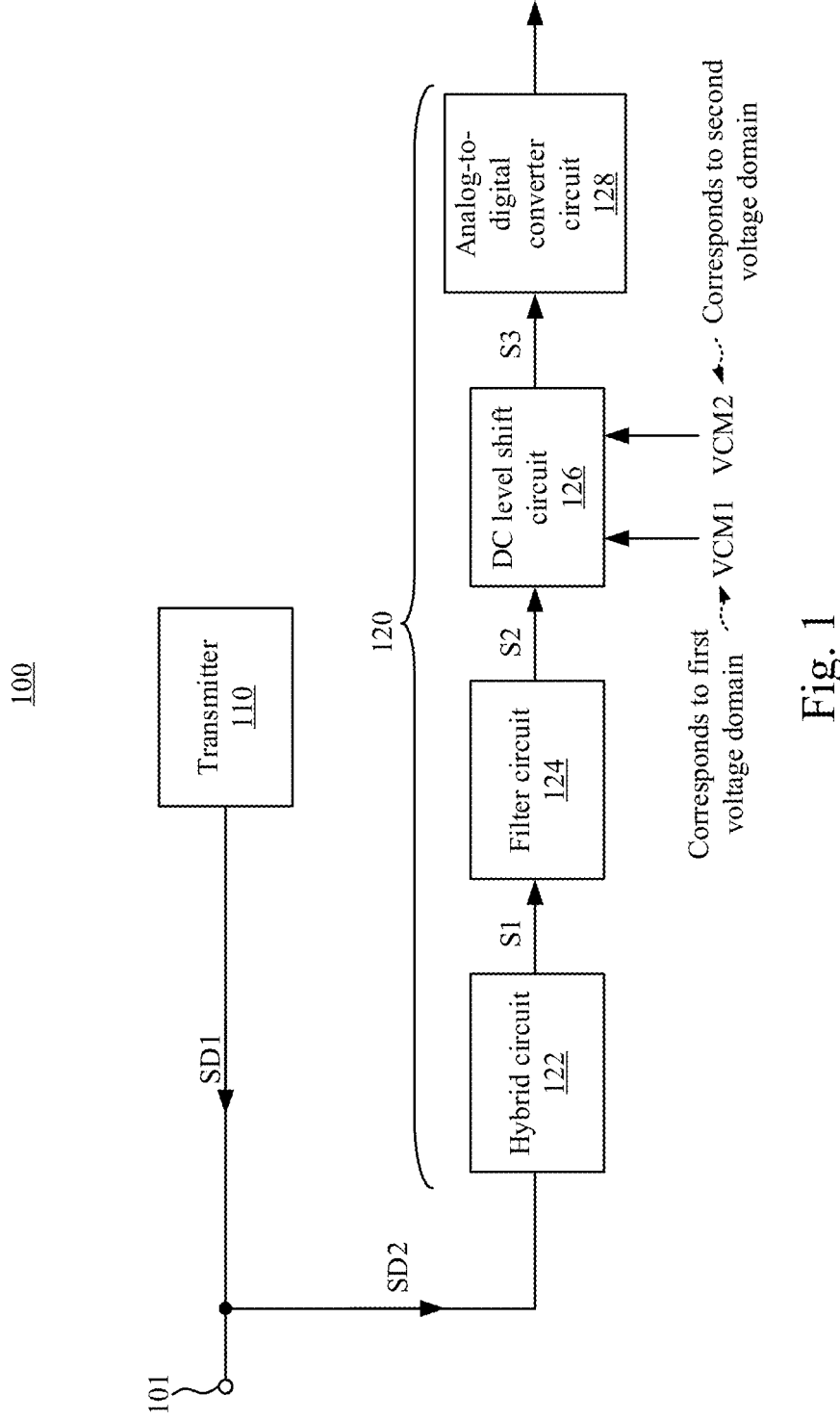
FIG. 1 illustrates a schematic diagram of a communication system according to some embodiments of the present disclosure.

FIG. 1 illustrates a schematic diagram of a communication system 100 according to some embodiments of the present disclosure. In some embodiments, the communication system 100 may be applied to a wired communication, such as an Ethernet system, but the present disclosure is not limited thereto. The communication system 100 includes a transmitter 110 and a receiver 120. The transmitter 110 may output a data signal SD1 to other devices (not shown) through a network cable (not shown) via a terminal 101. The receiver 120 may receive a data signal SD2 from other devices through the same network cable via the same terminal 101. In some embodiments, the data signals SD1 and SD2 may be, but are not limited to, signals transmitted via Ethernet, and are transmitted through a network cable with twisted-pair cables.

In some embodiments, the receiver 120 includes a hybrid circuit 122, a filter circuit 124, a DC (direct current) level shift circuit 126, and an analog-to-digital converter circuit 128. The hybrid circuit 122 is configured to receive the data signal SD2 and generate signal S1 accordingly. In some embodiments, the hybrid circuit 122 may be configured to eliminate the echo caused by the transmitter 110. For example, the hybrid circuit 122 may include a first resistor and a second resistor (not shown). The first resistor may convert the signal on terminal 101 into a first current signal, and the second resistor may convert the signal on the negative output terminal of the transmitter 110 into a second current signal. By setting the resistance values of the first resistor and the second resistor, the first current signal and the second current signal may cancel each other out at the input terminal of the filter circuit 124, thereby reducing the impact of echo on the data signal SD2 and generating signal S1 accordingly. The above arrangements of the hybrid circuit 122 are given for illustrative purposes, and the present disclosure is not limited thereto.

The filter circuit 124 generates a signal S2 according to signal S1. For example, the filter circuit 124 may perform low-pass filtering on the signal S1 to generate signal S2. The DC level shift circuit 126 is configured to receive the signal S2 and generate a signal S3. In some embodiments, to enable data transmission over longer distances, the transmitter 110 transmits the data signal SD1 at a higher power. For example, the transmitter 110 operates under a first voltage domain, where the highest voltage in the first voltage domain may be about, but not limited to, 3.3 volts. Under this condition, to process the echo from the transmitter 110, the hybrid circuit 122 and the filter circuit 124 also operate under the first voltage domain. To reduce the overall power consumption of the receiver 120, the other circuits of the receiver 120 may operate under a lower second voltage domain, where the highest voltage in the second voltage domain (which is lower than the highest voltage in the first voltage domain) may be about, but not limited to, 0.9 volts.

The DC level shift circuit 126 receives the signal S2 and generates a signal S3. In some embodiments, the DC level shift circuit 126 may adjust the common-mode level of the signal S2 to generate the signal S3. In some embodiments, the DC level shift circuit 126 may be a passive circuit. In some embodiments, the aforementioned passive circuit may be a circuit that does not provide a voltage gain. For example, the DC level shift circuit 126 may include a capacitor (e.g., the capacitor C shown in FIG. 2A or 3A) and switches, where the switches are configured to transmit (or transfer) the signal without amplifying the transmitted signal. Before receiving the signal S2, the DC level shift circuit 126 transmits a common-mode voltage VCM1 of the first voltage domain to the first terminal of the aforementioned capacitor, and transmits a common-mode voltage VCM2 of the second voltage domain to the second terminal of the aforementioned capacitor. When the DC level shift circuit 126 receives the signal S2, the DC level shift circuit 126 stops transmitting the common-mode voltages VCM1 and VCM2 to the capacitor. In some embodiments, the common-mode voltage VCM1 may be higher than the common-mode voltage VCM2, but the present disclosure is not limited thereto. For example, as previously mentioned, the highest voltage in the first voltage domain may be about 3.3 volts, and the highest voltage in the second voltage domain may be about 0.9 volts. Under this condition, the common-mode voltage VCM1 may be about 1.65 volts, and the common-mode voltage VCM2 may be about 0.5 volts. The aforementioned voltage values are given for illustrative purposes, and the present disclosure is not limited thereto. The analog-to-digital converter circuit 128 is configured to convert the signal S3 into a digital signal SD3 and provide the digital signal SD3 to digital circuits in the system (not shown) for subsequent signal processing. In some embodiments, the analog-to-digital converter circuit 128 may be various types of analog-to-digital converter circuits, which may include, but not limited to, successive approximation register (SAR) analog-to-digital converter circuits.

In some related approaches, a source follower is employed in the receiver to perform level shifting of signals. However, the source follower is an active circuit that provides the voltage gain, which results in additional power consumption and nonlinear distortion. Compared with those approaches, in some embodiments of the present disclosure, the DC level shift circuit 126 is a passive circuit, which may have lower power consumption and reduce the impact of nonlinear distortion.

Figure 2A:
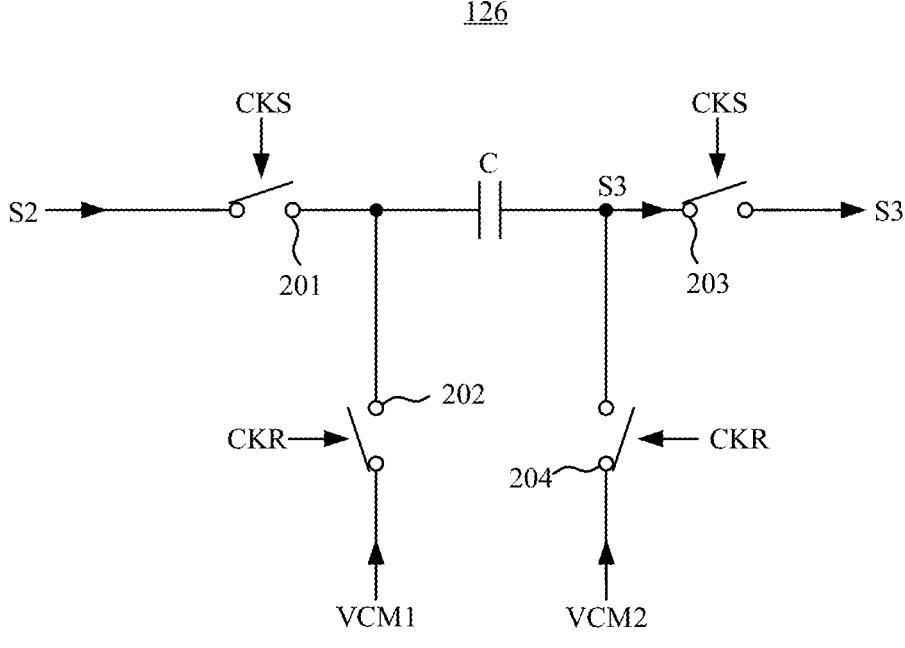
FIG. 2A illustrates a schematic diagram of the DC level shift circuit in FIG. 1 according to some embodiments of the present disclosure.

FIG. 2A illustrates a schematic diagram of the DC level shift circuit 126 in FIG. 1 according to some embodiments of the present disclosure. In some embodiments, the DC level shift circuit 126 includes a capacitor C and switches 201, 202, 203, and 204. A first terminal of the switch 201 receives the signal S2, a second terminal of the switch 201 is coupled to a first terminal of the capacitor C, and a control terminal of the switch 201 receives a control signal CKS. A first terminal of the switch 202 is coupled to a first terminal of capacitor C, a second terminal of the switch 202 receives the common-mode voltage VCM1, and a control terminal of the switch 202 receives a control signal CKR. A first terminal of the switch 203 is coupled to a second terminal of capacitor C to receive the signal S3, a second terminal of the switch 203 is configured to output the signal S3, and a control terminal of switch 203 receives the control signal CKS. A first terminal of the switch 204 is coupled to the second terminal of the capacitor C, a second terminal of the switch 204 receives the common-mode voltage VCM2, and the control terminal of the switch 204 receives the control signal CKR.

With the above arrangements, the switch 201 may be configured to be turned on according to the control signal CKS to transmit the signal S2 to the first terminal of capacitor C. The switch 202 may be configured to be turned on according to the control signal CKR to transmit the common-mode voltage VCM1 to the first terminal of capacitor C. The switch 203 may be configured to be turned on according to the control signal CKS to output the signal S3 from the second terminal of capacitor C to the analog-to-digital converter circuit 128 in FIG. 1. The switch 204 may be configured to be turned on according to the control signal CKR to transmit the common-mode voltage VCM2 to the second terminal of capacitor C.

Figure 2B:
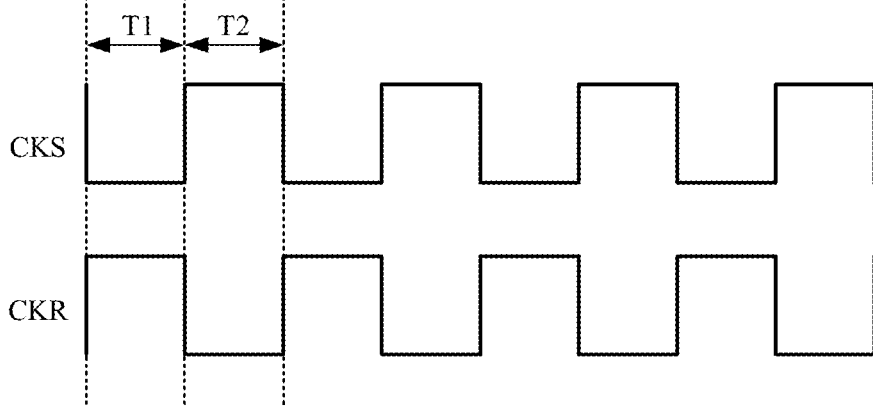
FIG. 2B illustrates a waveform diagram of the control signals in FIG. 2A according to some embodiments of the present disclosure.

FIG. 2B illustrates a waveform diagram of the control signals CKS and CKR in FIG. 2A according to some embodiments of the present disclosure. In some embodiments, the phases of control signals CKS and CKR are opposite to each other. For example, during a period T1, the control signal CKR has an enable level (for example, but not limited to, a high level), while the control signal CKS has a disable level (for example, but not limited to, a low level). Under this condition, the switches 201 and 203 are not turned on according to the control signal CKS, while the switches 202 and 204 are turned on according to the control signal CKR, thereby transmitting the common-mode voltages VCM1 and VCM2 to the first and second terminals of the capacitor C, respectively. As a result, the levels at the first and second terminals of capacitor C will be at the common-mode voltages VCM1 and VCM2, respectively, during the period T1. During a period T2, the control signal CKR switches to the disable level, while the control signal CKS switches to the enable level. Under this condition, the switches 202 and 204 are not turned on according to the control signal CKR, thus stopping the transmission of the common-mode voltages VCM1 and VCM2 to the capacitor C. On the other hand, the switches 201 and 203 may be turned on according to the control signal CKS. The switch 201 may transmit the signal S2 to the first terminal of the capacitor C during the period T2. In some embodiments, the common-mode level of the signal S2 is set to be the same as the common-mode voltage VCM1, so that the DC level difference between the first and second terminals of capacitor C does not change during the period T2. As such, the behavior of capacitor C during the period T2 is equivalent to a battery, so that the capacitor C may transfer the AC component of the signal S2 to its second terminal. This AC component may superimpose with the level at the second terminal (i.e., common-mode voltage VCM2) to form the signal S3, and the switch 203 may output the signal S3 to the analog-to-digital converter circuit 128 in FIG. 1.

In other words, before the DC level shift circuit 126 receives the signal S2 (i.e., before the switches 201 and 203 are turned on), the switches 202 and 204 are turned on to reset the first and second terminals of the capacitor C to the common-mode voltages VCM1 and VCM2, respectively. After the DC level shift circuit 126 starts receiving the signal S2 (i.e., when the switches 201 and 203 are turned on), the switches 202 and 204 are not turned on to stop transmitting the common-mode voltages VCM1 and VCM2 to the capacitor C. Thus, by utilizing the component characteristics of the capacitor C, level shifting may be achieved without employing active circuits. In some embodiments, as the switches 201 and 202 process signals from the first voltage domain (e.g., the signal S2 and the common-mode voltage VCM1), and the signals in the first voltage domain have a higher voltage level, each of the switches 201 and 202 may be implemented with input or output (I/O) transistors that are capable of withstanding higher voltages. Similarly, as the switches 203 and 204 process signals from the second voltage domain (e.g., the signal S3 and the common-mode voltage VCM2), and the signals in the second voltage domain have a lower voltage level, each of the switches 203 and 204 may be implemented with core transistors that are suited for low-voltage environments. Likewise, as the analog-to-digital converter circuit 128 in FIG. 1 processes the signal S3 from the second voltage domain, at least part of the circuit in the analog-to-digital converter circuit 128 may also be implemented with core transistors, so as to reduce overall power consumption.

Figure 3A:
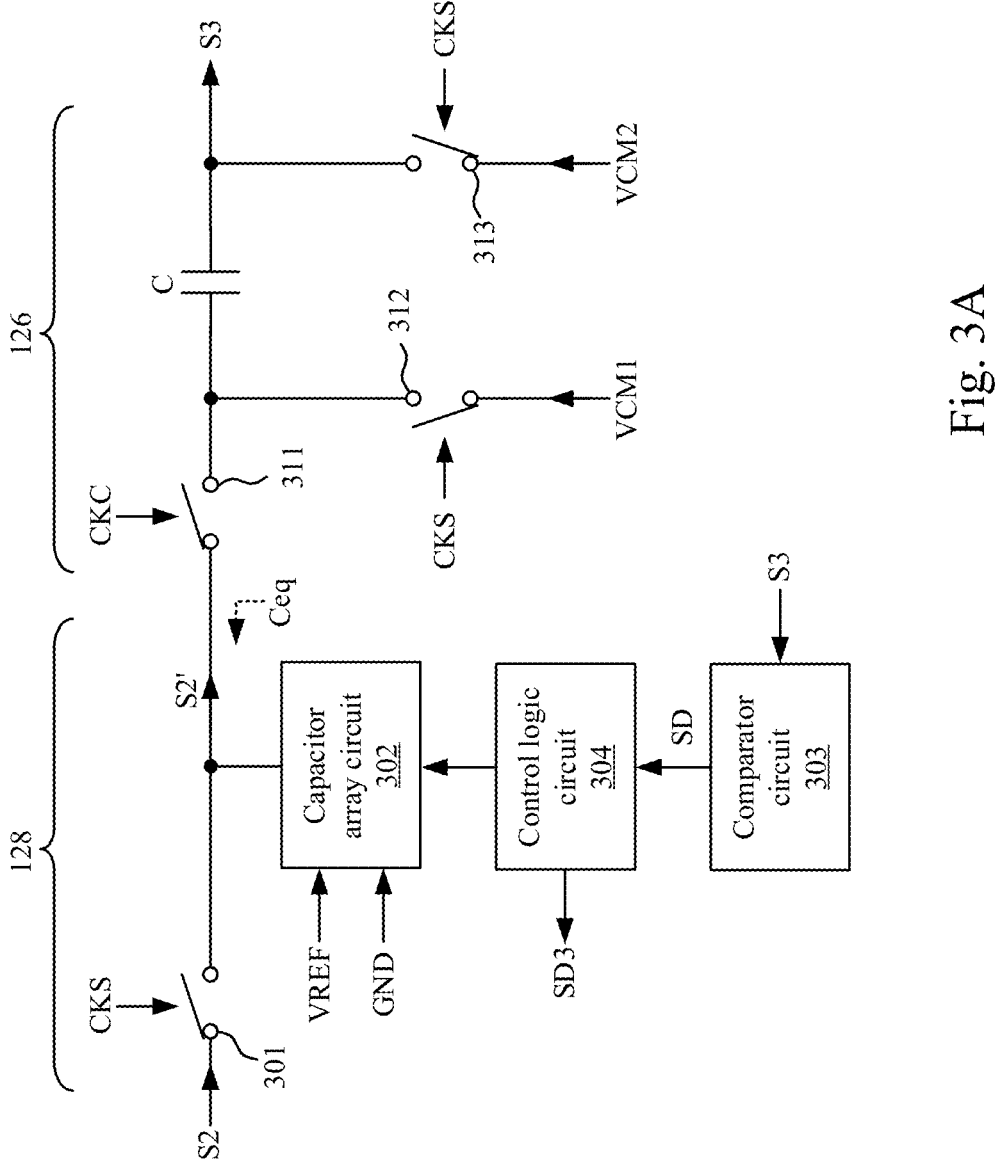
FIG. 3A illustrates a schematic diagram of the DC level shift circuit and the analog-to-digital converter circuit in FIG. 1 according to some embodiments of the present disclosure.

FIG. 3A illustrates a schematic diagram of the DC level shift circuit 126 and the analog-to-digital converter circuit 128 in FIG. 1 according to some embodiments of the present disclosure. In this example, the analog-to-digital converter circuit 128 may be a SAR analog-to-digital converter circuit, which includes a sampling switch 301, a capacitor array circuit 302, a comparator circuit 303, and a control logic circuit 304.

The sampling switch 301 may be turned on according to the control signal CKS to transmit the signal S2 to the capacitor array circuit 302. In other words, the capacitor array circuit 302 may sample the signal according to the control signal CKS. The capacitor array circuit 302 includes capacitors (not shown) and switches (not shown), where the switches may be controlled by the control logic circuit 304 to selectively transmit a reference voltage VREF or a ground voltage GND to the capacitors. The DC level shift circuit 126 may transmit the signal S2 sampled by the capacitor array circuit 302 (hereinafter referred to as signal S2') to the first terminal of capacitor C according to the control signal CKC, in order to generate signal S3. The comparator circuit 303 may receive signal S3 from the DC level shift circuit 126 to generate a decision signal SD. The control logic circuit 304 may perform the SAR algorithm according to the decision signal SD to sequentially switch the switches in the capacitor array circuit 302 and sequentially generate bits in the digital signal SD3.

The DC level shift circuit 126 includes a capacitor C and switches 311, 312, and 313. A first terminal of the switch 311 is coupled to the capacitor array circuit 302 to receive the signal S2', a second terminal of the switch 311 is coupled to a first terminal of the capacitor C, and a control terminal of the switch 311 receives the control signal CKC. A first terminal of the switch 312 is coupled to the first terminal of capacitor C, a second terminal of the switch 312 receives the common-mode voltage VCM1, and a control terminal of the switch 312 receives the control signal CKS. A first terminal of the switch 313 is coupled to a second terminal of capacitor C, a second terminal of the switch 313 receives the common-mode voltage VCM2, and a control terminal of the switch 313 receives the control signal CKS. In some embodiments, in order to avoid affecting operations of the analog-to-digital converter circuit 128, the capacitance value of the capacitor C is set to be greater than the capacitance value of the capacitor array circuit 302 (e.g., the equivalent capacitance Ceq in FIG. 3A). For example, the capacitance value of capacitor C may be set to be greater than or equal to 1.5 times the capacitance value of the capacitor array circuit 302, but the present disclosure is not limited thereto.

With the above arrangements, the switch 311 may be turned on according to the control signal CKC to transmit the signal S2' to the first terminal of the capacitor C. The switch 312 may be turned on according to the control signal CKS to transmit the common-mode voltage VCM1 to the first terminal of the capacitor C. The switch 313 may be turned on according to the control signal CKS to transmit the common-mode voltage VCM2 to the second terminal of capacitor C.

Figure 3B:
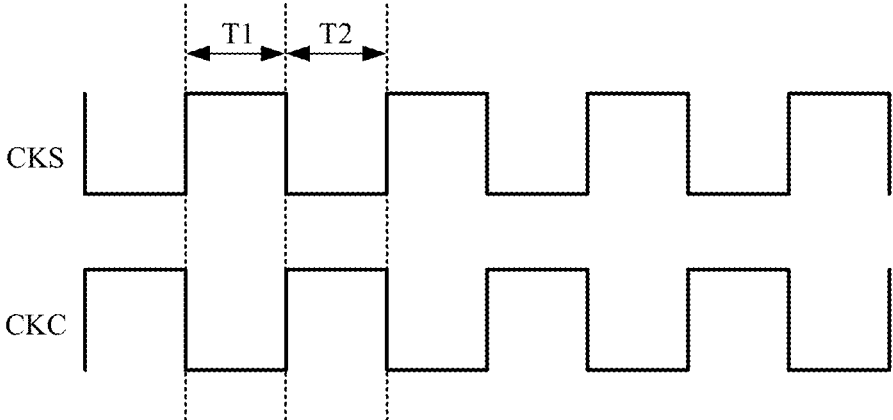
FIG. 3B illustrates a waveform diagram of the control signals in FIG. 3A according to some embodiments of the present disclosure.

FIG. 3B illustrates a waveform diagram of the control signals CKS and CKC in FIG. 3A according to some embodiments of the present disclosure. In some embodiments, the phases of the control signals CKS and CKC are opposite to each other. For example, during the period T1, the control signal CKS has an enable level (which may be, for example but not limited to, a high level), while the control signal CKC has a disable level (which may be, for example but not limited to, a low level). Under this condition, the switch 311 is not turned on according to the control signal CKC, while the sampling switch 301, the switch 312, and the switch 313 are turned on according to the control signal CKS. Under this condition, the capacitor array circuit 302 may sample the signal S2 to generate the signal S2', and the switches 312 and 313 may transmit the common-mode voltages VCM1 and VCM2 to the first and second terminals of the capacitor C, respectively. As a result, the levels at the first and second terminals of the capacitor C during the period T1 will respectively be at the common-mode voltages VCM1 and VCM2. During the period T2, the control signal CKS switches to the disable level, while the control signal CKC switches to the enable level. Under this condition, the sampling switch 301 and the switches 312 and 313 are not turned on according to control signal CKS, thereby stopping the transmission of the signal S2 to the capacitor array circuit 302 and stopping the transmission of the common-mode voltages VCM1 and VCM2 to the first and second terminals of the capacitor C. On the other hand, the switch 311 is turned on according to the control signal CKC to transmit the signal S2' to the first terminal of the capacitor C. Based on analogous operations described in FIG. 2B, the capacitor C may generate the signal S3 and transmit this signal S3 to the comparator circuit 303. Thus, the control logic circuit 304 may generate the digital signal SD3 according to the decision signal SD provided by the comparator circuit 303.

In other words, before the DC level shift circuit 126 receives the signal S2$^T$ (i.e., when the switch 311 is not turned on), the switches 312 and 313 are turned on to respectively reset the first and second terminals of the capacitor C to the common-mode voltages VCM1 and VCM2. After the DC level shift circuit 126 starts to receive the signal S2$^T$ (i.e., when the switch 311 is turned on), the switches 312 and 313 are not turned on to stop transmitting the common-mode voltages VCM1 and VCM2 to the capacitor C. In some embodiments, due to the sampling switch 301, switches in the capacitor array circuit 302, the switch 311, and the switch 312 are configured to process signals of the first voltage domain (e.g., the signals S2, S2', and the common-mode voltage VCM1), each of the sampling switch 301, switches in the capacitor array circuit 302, the switch 311, and the switch 312 may be implemented with the aforementioned I/O transistors (input or output transistors). In some embodiments, due to the switch 313, the comparator circuit 303, and the control logic circuit 304 processing the signals of the second voltage domain (e.g., the signal S3, the common-mode voltage VCM2, and the decision signal SD), each of the switch 313, the comparator circuit 303, and the control logic circuit 304 may be implemented with the aforementioned core transistors, thereby reducing more power consumption.

As described above, a receiver provided in some embodiments of the present disclosure may utilize passive circuit(s) for DC level shifting, in order to reduce the impact of nonlinear distortion and lower power consumption.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A receiver for wired communication, the receiver comprising:
   a direct current (DC) level shift circuit configured to receive a first signal and generate a second signal,
   wherein the DC level shift circuit comprises a capacitor, and the DC level shift circuit is further configured to transmit a first common-mode voltage in a first voltage domain to a first terminal of the capacitor and transmit a second common-mode voltage in a second voltage domain to a second terminal of the capacitor before the first signal is received, and when the DC level shift circuit receives the first signal, the DC level shift circuit stops transmitting the first common-mode voltage and the second common-mode voltage to the capacitor;
   an analog-to-digital converter (ADC) circuit configured to generate a digital signal according to the second signal;
   a filter circuit configured to generate the first signal according to a third signal; and
   a hybrid circuit configured to receive a data signal and eliminate an echo caused by a transmitter to generate the third signal.

2. The receiver of claim 1, wherein the DC level shift circuit further comprises:
   a first switch configured to be turned on according to a first control signal, in order to transmit the first signal to the first terminal of the capacitor;
   a second switch configured to be turned on according to a second control signal, in order to transmit the first common-mode voltage to the first terminal of the capacitor;
   a third switch configured to be turned on according to the first control signal, in order to output the second signal from the second terminal of the capacitor; and
   a fourth switch configured to be turned on according to the second control signal, in order to transmit the second common-mode voltage to the second terminal of the capacitor.

3. The receiver of claim 2, wherein each of the first switch and the second switch is implemented with an input or output transistor, and each of the third switch and the fourth switch is implemented with a core transistor.

4. The receiver of claim 2, wherein phases of the first control signal and the second control signal are opposite to each other.

5. The receiver of claim 1, wherein the DC level shift circuit is a passive circuit.

6. The receiver of claim 1, wherein a highest voltage in the first voltage domain is higher than a highest voltage in the second voltage domain.

7. The receiver of claim 1, wherein the first common-mode voltage is higher than the second common-mode voltage.

8. The receiver of claim 1, wherein the data signal is a signal transmitted via Ethernet.

9. A receiver for wired communication, the receiver comprising:
   a direct current (DC) level shift circuit configured to receive a first signal and generate a second signal,
   wherein the DC level shift circuit comprises a capacitor, and the DC level shift circuit is further configured to transmit a first common-mode voltage in a first voltage domain to a first terminal of the capacitor and transmit a second common-mode voltage in a second voltage domain to a second terminal of the capacitor before the first signal is received, and when the DC level shift circuit receives the first signal, the DC level shift circuit stops transmitting the first common-mode voltage and the second common-mode voltage to the capacitor; and
   an analog-to-digital converter (ADC) circuit configured to generate a digital signal according to the second signal,
   wherein the ADC circuit comprises:
   a capacitor array circuit configured to sample the first signal according to a first control signal, wherein the DC level shift circuit transmits the first signal sampled by the capacitor array circuit to the first terminal of the capacitor according to a second control signal, in order to generate the second signal.

10. The receiver of claim 9, wherein the DC level shift circuit further comprises:

a first switch configured to be turned on according to the second control signal, in order to transmit the sampled first signal to the first terminal of the capacitor;

a second switch configured to be turned on according to the first control signal, in order to transmit the first common-mode voltage to the first terminal of the capacitor; and a third switch configured to be turned on according to the first control signal, in order to transmit the second common-mode voltage to the second terminal of the capacitor.

11. The receiver of claim 10, wherein each of switches in the capacitor array circuit, the first switch, and the second switch is implemented with an input or output transistor, and the third switch is implemented with a core transistor.

12. The receiver of claim 9, wherein a capacitance value of the capacitor is greater than a capacitance value of the capacitor array circuit.

13. The receiver of claim 9, wherein phases of the first control signal and the second control signal are opposite to each other.

14. The receiver of claim 9, wherein the ADC circuit comprises further comprises:

a comparator circuit configured to generate a decision signal according to the second signal; and a control logic circuit configured to generate the digital signal according to the decision signal, wherein each of the comparator circuit and the control logic circuit is implemented with a core transistor.

15. The receiver of claim 9, further comprising:

a sampling switch configured to be turned on according to the first control signal to transmit the first signal to the capacitor array circuit.

* * * * *